United States Patent
Nagel

(10) Patent No.: US 10,910,351 B2
(45) Date of Patent: Feb. 2, 2021

(54) OPTOELECTRONIC COMPONENT AND METHOD OF PRODUCING AN OPTOELECTRONIC COMPONENT

(71) Applicant: OSRAM Opto Semiconductors GmbH, Regensburg (DE)

(72) Inventor: Peter Nagel, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/195,904

(22) Filed: Nov. 20, 2018

(65) Prior Publication Data
US 2019/0157249 A1    May 23, 2019

(30) Foreign Application Priority Data

Nov. 22, 2017    (DE) .................. 10 2017 127 597

(51) Int. Cl.
| | |
|---|---|
| H01L 25/075 | (2006.01) |
| H01L 33/00  | (2010.01) |
| H01L 33/50  | (2010.01) |
| H01L 33/60  | (2010.01) |
| H01L 33/56  | (2010.01) |
| H01L 33/54  | (2010.01) |

(52) U.S. Cl.
CPC ........ *H01L 25/0753* (2013.01); *H01L 33/005* (2013.01); *H01L 33/50* (2013.01); *H01L 33/60* (2013.01); *H01L 33/54* (2013.01); *H01L 33/56* (2013.01); *H01L 2933/005* (2013.01); *H01L 2933/0058* (2013.01)

(58) Field of Classification Search
None
See application file for complete search history.

(56) References Cited

U.S. PATENT DOCUMENTS

2017/0155022 A1\* 6/2017 Tomonari ................ H01L 33/62
2017/0365746 A1\* 12/2017 Vampola ................ H01L 33/46

FOREIGN PATENT DOCUMENTS

| EP | 3 174 110 A1 | 5/2017 |
|----|---|---|
| JP | 2015-008329 A | 1/2015 |
| WO | 2016/094422 A1 | 6/2016 |

\* cited by examiner

*Primary Examiner* — Alexander G Ghyka
(74) *Attorney, Agent, or Firm* — DLA Piper LLP (US)

(57) ABSTRACT

An optoelectronic component includes a carrier including a mounting face, wherein at least one optoelectronic semiconductor chip configured to emit electromagnetic radiation is arranged above the mounting face, a molding material is arranged above the mounting face, the optoelectronic semiconductor chips are embedded into the molding material, a cavity is formed in the molding material, the cavity is empty, radiation emission faces of the optoelectronic semiconductor chips are not covered by the molding material, the cavity is accessible through an opening in the molding material, and an opening face of the opening is smaller than a sum of all radiation emission faces of the optoelectronic semiconductor chips.

4 Claims, 4 Drawing Sheets

OPTOELECTRONIC COMPONENT AND METHOD OF PRODUCING AN OPTOELECTRONIC COMPONENT

TECHNICAL FIELD

This disclosure relates to an optoelectronic component and a method of producing an optoelectronic component.

BACKGROUND

Optoelectronic components comprising optoelectronic semiconductor chips arranged in a cavity of a housing body are known. There is nonetheless a need for an improved optoelectronic component and method of producing an optoelectronic component.

SUMMARY

I provide an optoelectronic component including a carrier including a mounting face, wherein at least one optoelectronic semiconductor chip configured to emit electromagnetic radiation is arranged above the mounting face, a molding material is arranged above the mounting face, the optoelectronic semiconductor chips are embedded into the molding material, a cavity is formed in the molding material, the cavity is empty, radiation emission faces of the optoelectronic semiconductor chips are not covered by the molding material, the cavity is accessible through an opening in the molding material, and an opening face of the opening is smaller than a sum of all radiation emission faces of the optoelectronic semiconductor chips.

I also provide a method of producing an optoelectronic component including providing a carrier including a mounting face, arranging at least one optoelectronic semiconductor chip configured to emit electromagnetic radiation above the mounting face of the carrier, arranging a sacrificial body of salt above the radiation emission faces of the optoelectronic semiconductor chips, arranging and curing a molding material above the mounting face of the carrier, wherein the optoelectronic semiconductor chips and the sacrificial body are embedded into the molding material, and removing the sacrificial body, wherein an empty cavity including a geometric shape corresponding to the sacrificial body remains in the molding material, and an opening is produced in the molding material, wherein the cavity is accessible through the opening.

LIST OF REFERENCE SIGNS

Figure 1:
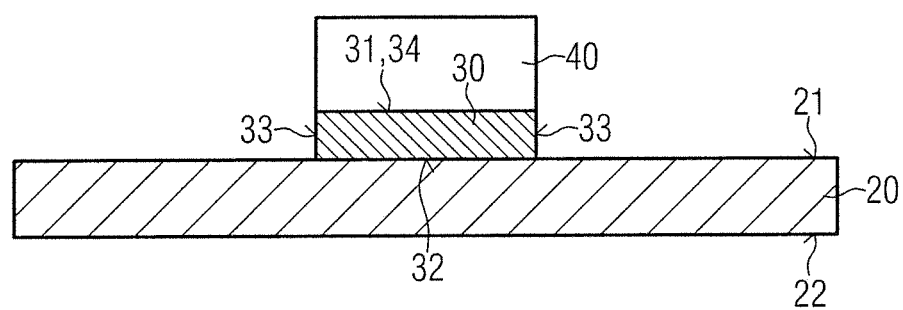
FIG. 1 schematically shows a side view of an optoelectronic semiconductor chip arranged above a carrier with a wavelength-converting material arranged above a radiation emission face.

11 First example of the optoelectronic component
12 Second example of the optoelectronic component
13 Third example of the optoelectronic component
20 Carrier
21 Mounting face of the carrier
22 Underside of the carrier
30 Optoelectronic semiconductor chip
31 Top side of the optoelectronic semiconductor chip
32 Underside of the optoelectronic semiconductor chip
33 Side faces of the optoelectronic semiconductor chip
34 Radiation emission face of the optoelectronic semiconductor chip
40 Wavelength-converting material
50 Sacrificial body
51 Top side of the sacrificial body
60 Molding material
61 Concavely formed section of the molding material
62 Surface of the molding material
63 Inner wall of the molding material
71 Cavity
72 Opening
73 Opening face of the opening
80 Electromagnetic radiation
90 Square
100 Channels

DETAILED DESCRIPTION

My optoelectronic component comprises a carrier comprising a mounting face. At least one optoelectronic semiconductor chip configured to emit electromagnetic radiation is arranged above the mounting face. A molding material is arranged above the mounting face, wherein the optoelectronic semiconductor chips are embedded into the molding material. A cavity is formed in the molding material. The cavity is empty. Radiation emission faces of the optoelectronic semiconductor chips are not covered by the molding material. The cavity is accessible through an opening in the molding material. An opening face of the opening is smaller than a sum of all radiation emission faces of the optoelectronic semiconductor chips. One advantage of the optoelectronic component is that the optoelectronic component may comprise a high luminance since electromagnetic radiation emitted at the radiation emission faces is radiated through the opening, the opening face of which is smaller than the sum of all radiation emission faces. A further advantage is that the geometry of the opening face is freely selectable such that different radiation characteristics may be generated. By way of example, the opening may be arranged directly above a portion of the radiation emission faces, while the radiation emission faces are otherwise covered by the molding material. This may be advantageous for automobile headlights, for example, since desired light distributions which may be adapted to the requirements of road traffic, for example, may be generated in this way.

The cavity may comprise a cross section tapering toward the opening at least in sections. Advantageously, the opening face of the opening may be smaller than a sum of all radiation emission faces of the optoelectronic semiconductor chips if the cross section of the cavity tapers toward the opening at least in sections.

The tapering cross section may be convexly formed. To put it another way, the molding material comprises a concavely formed section that is open toward the carrier. Advantageously, a parabolic mirror effect may be produced by a concavely formed section of the molding material. As a result, electromagnetic radiation emitted by the optoelectronic semiconductor chips may be focused onto a region between the optoelectronic semiconductor chips. In this case, there are the possibilities of the electromagnetic radiation impinging in this region either on the molding material or on the mounting face of the carrier. The electromagnetic radiation may then be reflected from this region toward the opening. For the purpose of reflecting the electromagnetic radiation, the mounting face of the carrier may itself be formed in a reflective fashion or comprise a reflective coating. The molding material may also be formed in a reflective fashion for this purpose.

The molding material may comprise embedded, reflective particles. Advantageously, reflectance of the molding material may be increased by embedded, reflective particles, whereby it is possible to increase the radiance of the electromagnetic radiation in the region of the opening.

A concavely formed section of the molding material may be arranged between the optoelectronic semiconductor chips and be open toward the opening. This example affords the advantage that electromagnetic radiation may be focused toward the opening. In this case, the concavely formed section may likewise bring about a parabolic mirror effect. In addition, a concavely formed section of the molding material that is open toward the carrier may focus electromagnetic radiation onto the concavely formed section of the molding material that is open toward the opening before the electromagnetic radiation is concentrated toward the opening. Such a combination may increase the radiance in the region of the opening particularly efficiently.

A wavelength-converting material may be arranged at least above a radiation emission face of the optoelectronic semiconductor chips. Advantageously, the wavelength-converting material is configured at least partly to modify the wavelength of the electromagnetic radiation emitted by the optoelectronic semiconductor chips. Consequently, the optoelectronic component may radiate a mixture of the originally emitted and the modified electromagnetic radiation. A desired color of the electromagnetic radiation may be generated in this way.

In a method of producing the optoelectronic component, a carrier comprising a mounting face is provided. At least one optoelectronic semiconductor chip configured to emit electromagnetic radiation is arranged above the mounting face of the carrier. A sacrificial body of salt is arranged above the radiation emission faces of the optoelectronic semiconductor chips. A molding material is arranged and cured above the mounting face of the carrier, wherein the optoelectronic semiconductor chips and the sacrificial body are embedded into the molding material. The sacrificial body is removed, wherein an empty cavity comprising a geometric shape corresponding to the sacrificial body remains in the molding material, wherein an opening is produced in the molding material. The cavity is accessible through the opening. This method affords the advantage that the geometric shapes of the cavity and the opening may be fashioned in a simple manner.

The sacrificial body may be removed by dissolving with a solvent. Dissolving the sacrificial body is one simple method of removing the sacrificial body.

Before removing the sacrificial body, the molding material may be eroded until the sacrificial body is accessible at a surface of the molding material. In this way, the sacrificial body is accessible at the surface of the molding material and may be removed. Moreover, in this way the opening face of the opening may be determined very accurately.

The sacrificial body may be formed already before it is arranged above the radiation emission faces. This may prevent undesired contamination of the radiation emission faces with the sacrificial material.

Arranging the sacrificial body above the radiation emission faces may comprise applying a salt above the radiation emission faces and processing the salt, as a result of which the sacrificial body is produced. This makes it possible to form the sacrificial body on the carrier. The use of an adhesive medium to fix the sacrificial body may thereby be obviated.

The salt may be processed by a cleavage method and/or a machining method. Advantageously, a salt may be removed in a simple manner in a later method step to produce the cavity in the molding material. Moreover, salt crystals may be brought to a desired shape by a cleavage method along cleavage planes. Alternatively or additionally, the shape of salt crystals may be fashioned by a machining method. Particularly if only few cleavage planes exist, the machining method enables a greater freedom of variation with regard to the geometric configuration of the sacrificial body.

The salt may be applied by an evaporation method and processed by a machining method. Arranging the salt by an evaporation method in which the salt crystallizes out by evaporation of a solvent, advantageously constitutes a simple method of arranging the salt above the radiation emission faces.

An adhesive may be used to arrange the sacrificial body. After removing the sacrificial body, the adhesive is dissolved with a further solvent. Advantageously, during the process of arranging the molding material, the sacrificial body placed by adhesive bonding remains at its position, without slipping in this case. The adhesive is dissolved with a solvent and removed so that the adhesive does not remain on the radiation emission faces and contaminate the latter after the process of removing the sacrificial body.

The above-described properties, features and advantages and the way in which they are achieved are clearer and more clearly understandable in association with the following description of examples explained in greater detail in association with the drawings.

FIG. 1 shows a schematic side view of an optoelectronic semiconductor chip 30 arranged above a mounting face 21 of a carrier 20.

The carrier 20 may comprise, for example, a metal, a ceramic, a glass, a plastic, a semiconductor or a semiconductor oxide. The carrier 20 may also be configured as a circuit board. The carrier 20 may be formed in a reflective fashion. However, it is also possible for a reflective coating to be arranged on the mounting face 21, this not being shown in FIG. 1.

The optoelectronic semiconductor chip 30 comprises a top side 31, an underside 32 and side faces 33. The optoelectronic semiconductor chip 30 is arranged by its underside 32 at the mounting face 21 of the carrier 20 in the illustration in FIG. 1. It is also possible for a plurality of optoelectronic semiconductor chips 30 to be arranged above the mounting face 21 of the carrier 20.

The optoelectronic semiconductor chip 30 is configured to emit electromagnetic radiation. The optoelectronic semiconductor chip 30 may emit electromagnetic radiation, for example, at its top side 31 and/or at its side faces 33. In the illustrated example in FIG. 1, the optoelectronic semiconductor chip is configured to emit electromagnetic radiation at its top side 31, which is intended to be designated as radiation emission face 34. The optoelectronic semiconductor chip 30 may be a light emitting diode chip, for example.

To be able to supply the optoelectronic semiconductor chip 30 with electrical energy for operation, the optoelectronic semiconductor chip 30 may comprise electrical contact pads at its underside 32, for example. The illustration of the electrical contact pads is omitted for the sake of simplicity. If the carrier 20 is configured as a circuit board, the electrical contact pads may be electrically contacted, for example, with conductor tracks of the circuit board exposed at the mounting face 21. However, the carrier 20 may also comprise electrical feedthroughs electrically connected to contact pads arranged at an underside 23 of the carrier 20.

A wavelength-converting material 40 is arranged above the radiation emission face 34 of the optoelectronic semiconductor chip 30. The wavelength-converting material 40 is configured at least partly to modify a wavelength of the electromagnetic radiation emitted by the optoelectronic semiconductor chip 30. By way of example, the wavelength-converting material 40 may convert blue light partially into yellow light such that white light may effectively be radiated.

The wavelength-converting material 40 may comprise, for example, a plastic with wavelength-converting particles embedded therein. The plastic may comprise silicone, for example. The wavelength-converting particles may comprise, for example, yttrium aluminum garnet doped with cerium ions (YAG:Ce$^{3+}$).

When the side faces 33 of the optoelectronic semiconductor chip 30 also serve as radiation emission faces 34, the wavelength-converting material 40 may also cover the side faces 33 of the optoelectronic semiconductor chip 30. However, the wavelength-converting material 40 may also be omitted if the optoelectronic semiconductor chip 30 may already emit electromagnetic radiation comprising a desired color.

Figure 2:
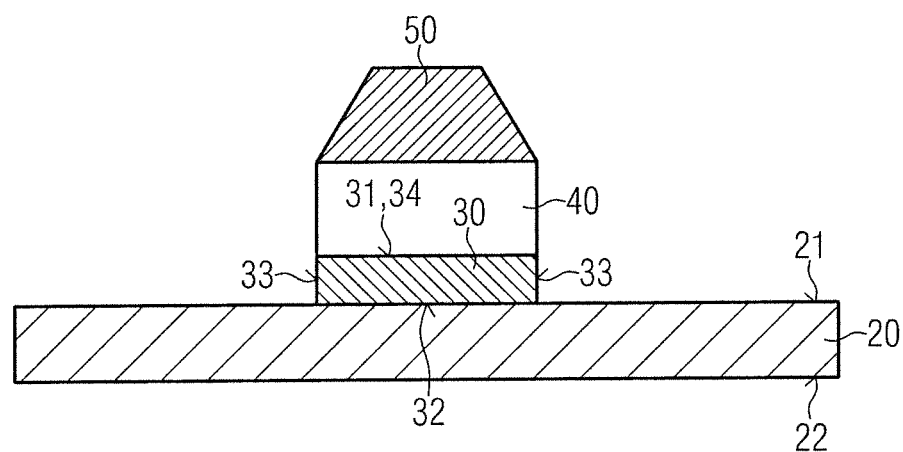
FIG. 2 schematically shows a side view corresponding to FIG. 1 with a sacrificial body arranged above the radiation emission face.

FIG. 2 shows a schematic side view of the arrangement from FIG. 1 in a temporally succeeding processing state.

A sacrificial body 50 has been arranged above the radiation emission face 34 of the optoelectronic semiconductor chip 30. In this case, the sacrificial body 50 is arranged on the wavelength-converting material 40. When wavelength-converting material 40 is provided, the sacrificial body 50 is arranged at the radiation emission face 34. If the optoelectronic semiconductor chip 30 is configured such that the side faces 33 also function as radiation emission faces 34, then the sacrificial body 50 may also be arranged laterally next to the optoelectronic semiconductor chip 30. In this case, the sacrificial body 50 may enclose the optoelectronic semiconductor chip 30 in a ring-shaped fashion.

The sacrificial body 50 comprises a trapezoidal cross section in the illustration in FIG. 2. However, this is not absolutely necessary. All that is necessary is for the sacrificial body 50 to comprise a cross section that widens at least in sections toward the radiation emission face 34. This will be explained in even greater detail in association with subsequent processing steps.

Before the sacrificial body 50 is arranged above the radiation emission face 34, the sacrificial body 50 may be formed from a sacrificial material. However, it is also possible for the sacrificial material first to be applied above the radiation emission face 34 and then to be processed, whereby the sacrificial body 50 is produced. If the sacrificial body 50 is produced before arranging above the radiation emission face 34, then it may be secured, for example, by an adhesive not illustrated in FIG. 2. This may prevent the sacrificial body 50 from slipping.

By way of example, a salt, for example, sodium chloride may be used as sacrificial material. The salt may be shaped to constitute the sacrificial body 50, for example, by a cleavage method and/or a machining method. A cleavage method may be used, for example, if the salt is present in the form of a single crystal. In this case, the salt may be cleaved along cleavage planes predefined by the crystal structure. Since the number of possible cleavage planes is often limited, as a result of which only certain geometric shapes of the sacrificial body 50 may be produced, the salt may alternatively or additionally be shaped to constitute the sacrificial body 50 by a machining method. By way of example, a CNC milling machine may be used for this purpose. A cleavage method may be used in particular if the sacrificial body 50 is intended to be produced before the sacrificial material is arranged above the radiation emission face 34. A machining method may also be used if the sacrificial material is first arranged above the radiation emission face 34 and then is intended to be formed to constitute the sacrificial body 50. In this regard, the salt may, for example, first be applied above the radiation emission face 34 by an evaporation method and then be shaped to constitute the sacrificial body 50 by a machining method. However, the salt, before it is arranged above the radiation emission face 34, may also be processed by a machining method. For this purpose, the salt may first be applied on an auxiliary carrier, for example, by an evaporation method and be processed.

As an alternative to the salt, a resist may also be used as sacrificial material. The resist may be processed by a photolithographic method, for example, to produce the sacrificial body 50. This may be carried out before or after arranging the resist above the radiation emission face 34.

If a resist is used as sacrificial material, then as an alternative or in addition to the photolithographic processing a surface tension of the resist may be utilized to produce a curved resist surface, i.e., a curved surface of the sacrificial body 50. This may be achieved by arranging the resist by a metering method, for example, such that the resist is present in the form of a droplet above the radiation emission face 34. The purpose of a curved surface of the sacrificial body 50 will be explained in association with subsequent processing steps.

A plastic, for example, a silicone may also be used as sacrificial material. The plastic may be processed, for example, by a molding method, for example, by compression molding to produce the sacrificial body 50. The plastic may already be shaped before arranging above the radiation emission face 34 and subsequently be arranged, for example, by adhesive bonding to the optoelectronic semiconductor chip 30. Alternatively, the plastic may be arranged directly above the radiation emission face 34 by a molding method, as a result of which the adhesive bonding may be obviated.

Figure 3:
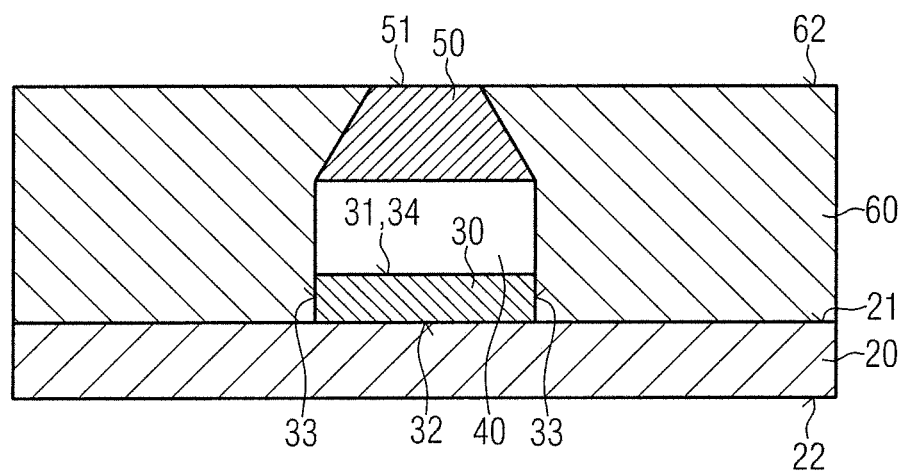
FIG. 3 schematically shows a side view corresponding to FIG. 2 with a molding material arranged above the carrier.

FIG. 3 shows a schematic side view of the arrangement from FIG. 2 in a temporally succeeding processing state.

A molding material 60 was arranged and cured above the mounting face 21 of the carrier 20. The molding material 60 was arranged such that the optoelectronic semiconductor chip 30 and the sacrificial body 50 are embedded into the molding material 60. In this case, the radiation emission face 34 of the optoelectronic semiconductor chip 30 is not covered by the molding material 60 since the radiation emission face 34 is covered by the wavelength-converting material 40 in the example illustrated. If no wavelength-converting material 40 is provided, then the radiation emission face 34 is covered by the sacrificial body 50 and not by the molding material 60.

In the illustration in FIG. 3, the molding material is arranged as far as a top side 51 of the sacrificial body 50. The top side 51 of the sacrificial body 50 is not covered by the molding material 60. The molding material 60 thus comprises an opening 72, through which the sacrificial body 50 is accessible. However, this is not absolutely necessary. The top side 51 of the sacrificial body 50 may initially also be covered by the molding material 60. The molding material 60 may be partly eroded in a later method step to create the opening 72 such that the sacrificial body 50 is accessible at a surface 62 of the molding material 60. For this purpose, a part of the molding material 60 and, if appropriate, a part of the sacrificial body 50 may be eroded by a grinding method, for example.

The molding material 60 may comprise a plastic, for example, a silicone or a polyphthalamide and be arranged above the mounting face 21 by a molding method, for example, by compression molding or transfer molding. The molding material 60 may also comprise embedded, reflective particles. The particles are configured to reflect electromagnetic radiation emitted by the optoelectronic semiconductor chip 30. This may increase a luminance of a finished optoelectronic component 11 since an absorption of the electromagnetic radiation by the molding material 60 may be higher without embedded, reflective particles.

Figure 4:
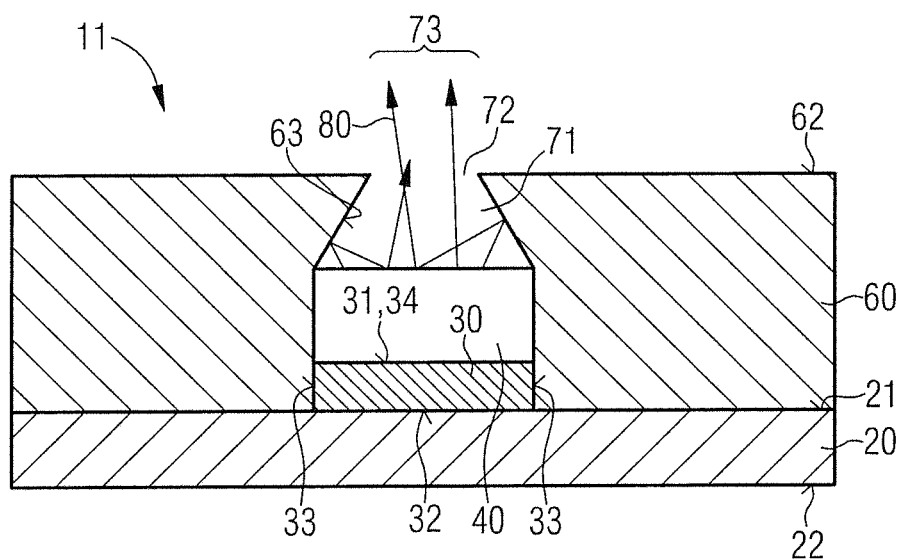
FIG. 4 schematically shows a side view corresponding to FIG. 3 of a first example of an optoelectronic component during operation, wherein the sacrificial body has been removed.

FIG. 4 shows a schematic side view of the completed optoelectronic component 11 during operation.

The sacrificial body 50 is removed. This results in an empty cavity 71 in the molding material 60. The cavity 71 comprises a geometric shape corresponding to the sacrificial body 50. The cavity 71 is accessible through the opening 72 in the molding material 60.

Removing the sacrificial body 50 may be carried out by dissolving the sacrificial body 50 by a solvent. If a salt is used as a sacrificial material, then water, for example, may be used as solvent. If a resist or a plastic is used as a sacrificial material, then, for example, acetone or an alkaline solution, for example, potassium hydroxide solution may be used as solvent.

If the sacrificial body 50 is adhesively bonded by the adhesive, then after removing the sacrificial body 50, the adhesive may be removed with a further solvent.

In the illustration in FIG. 4, the cavity 71 comprises a cross section tapering toward the opening 72. As a result, an opening face 73 of the opening 72 is smaller than the radiation emission face 34 of the optoelectronic semiconductor chip 30. This makes it possible that the luminance may be higher in the region of the opening 72 than in the region of the radiation emission face 34. Such an increase in the luminance may be present if a large portion of the electromagnetic radiation 80 emitted by the optoelectronic semiconductor chip 30 emerges from the cavity 71. This may be achieved by the high reflectivity of the molding material 60, for example, by reflective particles embedded therein. However, the cross section of the cavity 71 must taper toward the opening 72 at least in sections so that the opening face 73 is smaller than the radiation emission face 34.

Electromagnetic radiation 80 emitted by the optoelectronic semiconductor chip 30 is modified by the wavelength-converting material 40 and passes into the cavity 71 and subsequently out of the cavity 71 through the opening 72. In the cavity 71, the electromagnetic radiation 80 may be reflected at the inner wall 63 of the molding material 60. Since the opening face 73 of the opening 72 is smaller than the radiation emission face 34 of the optoelectronic semiconductor chip 30, the luminance may be increased in the region of the opening 72 compared to the radiation emission face 34.

Figure 5:
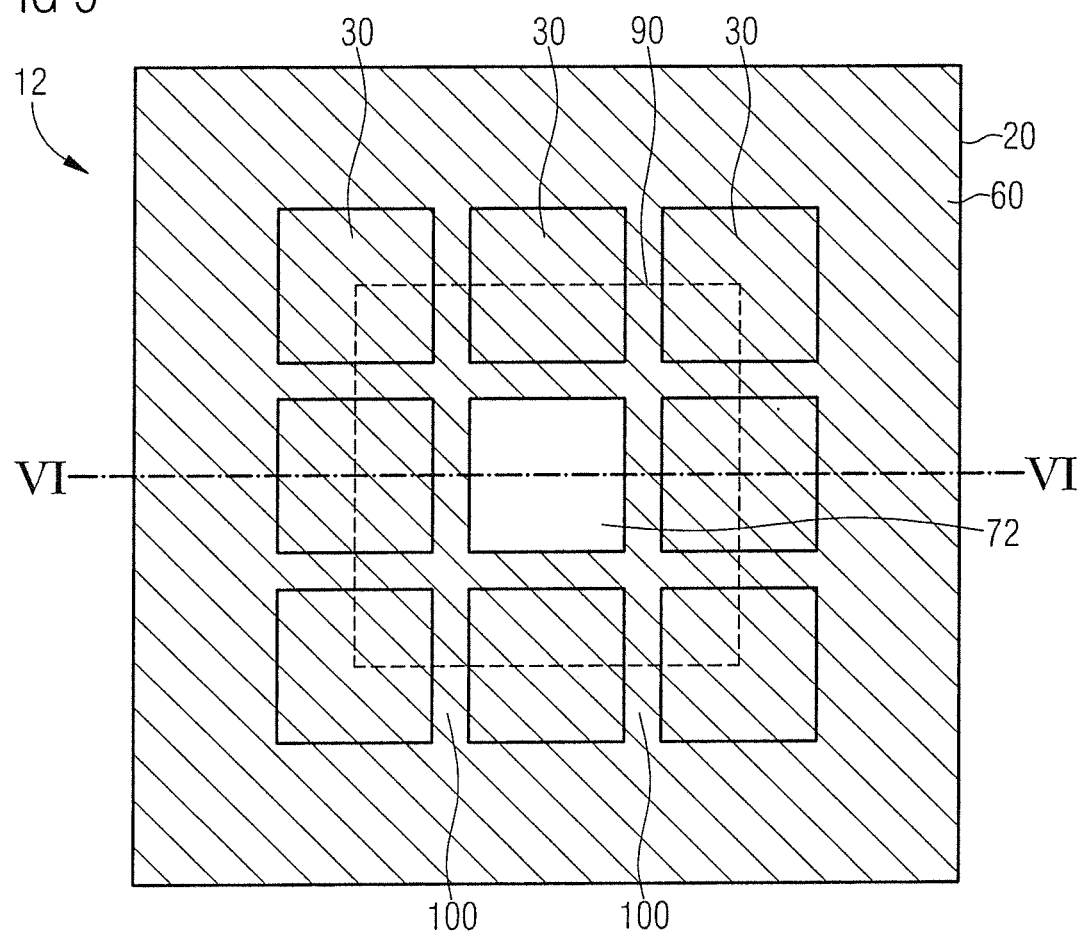
FIG. 5 schematically shows a plan view of a second example of the optoelectronic component.
Figure 6:
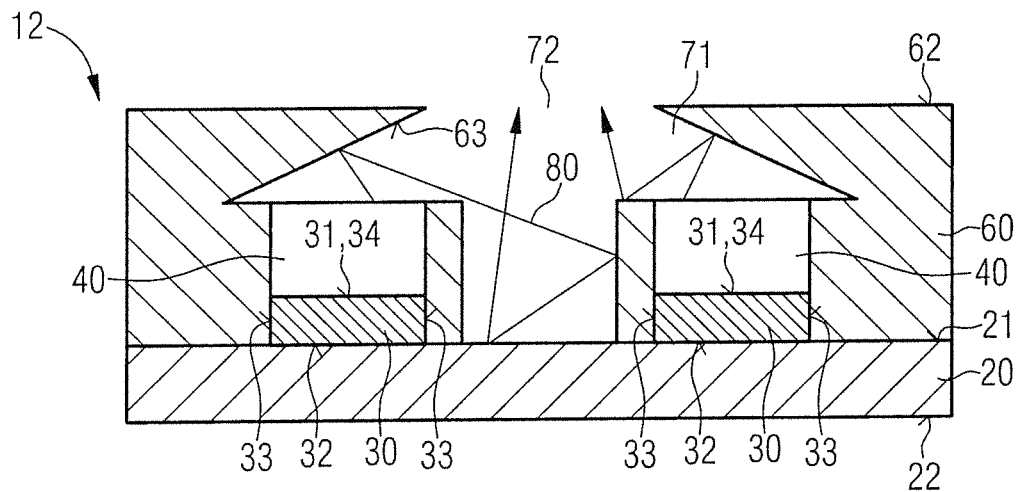
FIG. 6 schematically shows a lateral sectional view of the second example of the optoelectronic component.

FIG. 5 shows a schematic plan view of a second example of the optoelectronic component 12. FIG. 6 shows a schematic sectional view of the second example of the optoelectronic component 12.

In the second example of the optoelectronic component 12, a total of eight optoelectronic semiconductor chips 30 are arranged above the mounting face 21 of the carrier 20. In this case, the optoelectronic semiconductor chips 30 are arranged along an edge of a square 90 illustrated by dashed lines in the illustration in FIG. 5. However, the exact number of optoelectronic semiconductor chips 30 and the arrangement thereof may deviate from the example illustrated in FIG. 5.

The optoelectronic semiconductor chips 30 are arranged at a distance from one another. This gives rise to channels 100 between the optoelectronic semiconductor chips 30. The channels 100 make it possible that the molding material 60 may flow between the optoelectronic semiconductor chips 30 during production such that all the optoelectronic semiconductor chips 30 may be surrounded by the molding material 60 at their side faces 33.

The opening 72 in the molding material 60 is formed centrally with respect to the square 90 and comprises, in the example illustrated, an opening face 73 which is approximately of the same magnitude as the radiation emission face 34 of an optoelectronic semiconductor chip 30. However, the position of the opening 72 and the size of the opening face 73 may also deviate from the illustration in FIG. 5. However, the opening face 73 of the opening 72 is smaller than the sum of the radiation emission faces 34 of the optoelectronic semiconductor chips 30. The luminance of the optoelectronic component 12 may thus be increased in the region of the opening 72 compared to the luminance at the radiation emission faces 34. This arrangement comprising optoelectronic semiconductor chips 30 and the opening 72 may also be referred to as an atrium arrangement. It is also possible for a ninth optoelectronic semiconductor chip 30 to be arranged directly below the opening 72 and centrally with respect to the square 90.

FIG. 6 shows the atrium arrangement in lateral sectional view. The wavelength-converting material 40, which is not absolutely necessary, is arranged above the radiation emission faces 34. In the illustration in FIG. 6, the cavity 71, which was produced by removing the sacrificial body 50, comprises a cross section that tapers above the wavelength-converting material 40 toward the opening 72. The inner wall 63 of the molding material 60 that bounds the cavity 71 is formed in a conical fashion in this region. Below the conically formed inner wall 63, the cavity 71 comprises a rectangular cross section extending as far as the mounting face 21 of the carrier 20. This region of the cavity 71 is formed below the opening 72. Electromagnetic radiation 80 reflected at the conically formed inner wall 63 may impinge on that region of the mounting face 21 which is exposed below the opening 72, and may be reflected from there to the opening 72. For this purpose, the carrier 20 may either be formed in a reflective fashion or comprise a reflective coating.

Figure 7:
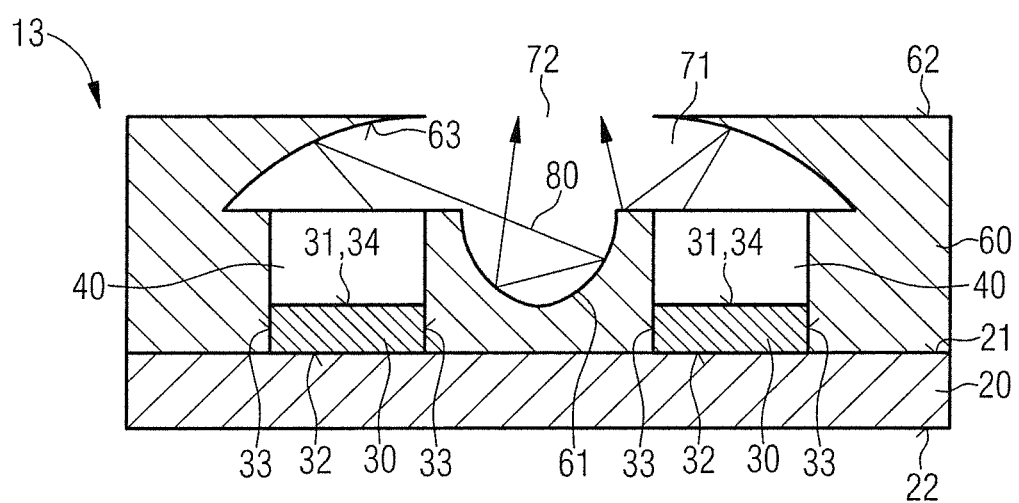
FIG. 7 schematically shows a lateral sectional view of a third example of the optoelectronic component.

FIG. 7 shows a schematic sectional view of a third example of the optoelectronic component 13. The third example of the optoelectronic component 13, which third example is likewise configured as an atrium arrangement, is greatly similar to the second example of the optoelectronic component 12. Only the differences are explained below.

In contrast to the second example of the optoelectronic component 12, the third example of the optoelectronic component 13 comprises a cavity 71 comprising, above the wavelength-converting material 40, a cross section that tapers toward the opening 72 and is convexly formed. To put it another way, in this section the molding material 60 is concavely formed and open toward the carrier 20. This may be realized, as already explained above, for example, by a section of the sacrificial body 50 formed in a curved fashion. A parabolic mirror effect may be brought about as a result. This effect causes electromagnetic radiation 80 to be focused onto a region between the optoelectronic semiconductor chips 30.

The molding material 60 comprises, between the optoelectronic semiconductor chips 30, a concavely formed section 61 that is open toward the opening 72. The concavely formed section 51 of the molding material 60 may be realized by a section of the sacrificial body 50 formed in a curved fashion. The concavely formed section 61 of the molding material 60 may likewise bring about a parabolic mirror effect. Electromagnetic radiation 80 that impinges from the concavely formed section of the molding material 60 that is open toward the carrier 20 onto the concavely formed section 61 of the molding material 60 that is open toward the opening 72 may be focused from the concavely formed section 61 toward the opening 72 and radiate out of the opening 72. However, the concavely formed section 61 of the molding material 60 may also be omitted. Alternatively, the molding material 60 may be formed in a plane fashion between the optoelectronic semiconductor chips 30.

My components and methods have been illustrated and described in more specific detail on the basis of preferred examples. Nevertheless, this disclosure is not restricted to the examples disclosed. Rather, other variations may be derived therefrom by those skilled in the art, without departing from the scope of protection of the appended claims.

This application claims priority of DE 10 2017 127 597.5, the subject matter of which is incorporated herein by reference.

The invention claimed is:

1. An optoelectronic component comprising a carrier comprising a mounting face,
   wherein at least one optoelectronic semiconductor chip configured to emit electromagnetic radiation is arranged above the mounting face,
   a molding material is arranged above the mounting face,
   the optoelectronic semiconductor chips are embedded into the molding material,
   a cavity is formed in the molding material,
   the cavity is empty,
   radiation emission faces of the optoelectronic semiconductor chips are not covered by the molding material,
   the cavity is accessible through an opening in the molding material, comprises a cross section tapering toward the opening at least in sections, and the tapering cross section is convexly formed,
   an opening face of the opening is smaller than a sum of all radiation emission faces of the optoelectronic semiconductor chips, and
   the molding material comprises a concavely formed section that is open toward the carrier and produces a parabolic mirror effect, whereby electromagnetic radiation emitted by the optoelectronic semiconductor chips is focused onto a region between the optoelectronic semiconductor chips and reflected from the region toward the opening.

2. The optoelectronic component according to claim 1, wherein the molding material comprises embedded, reflective particles.

3. The optoelectronic component according to claim 1, wherein a concavely formed section of the molding material is arranged between the optoelectronic semiconductor chips and open toward the opening.

4. The optoelectronic component according to claim 1, wherein a wavelength-converting material is arranged at least above a radiation emission face of the optoelectronic semiconductor chips.

* * * * *